United States Patent [19]
Whetsel

[11] Patent Number: 5,715,254
[45] Date of Patent: Feb. 3, 1998

[54] VERY LOW OVERHEAD SHARED RESOURCE BOUNDARY SCAN DESIGN

[75] Inventor: Lee D. Whetsel, Plano, Tex.

[73] Assignee: Texas Instruments Incorporated, Dallas, Tex.

[21] Appl. No.: 729,831

[22] Filed: Oct. 8, 1996

Related U.S. Application Data

[63] Continuation of Ser. No. 342,948, Nov. 21, 1994, abandoned.

[51] Int. Cl.[6] .................................................. G01R 31/28
[52] U.S. Cl. ........................ 371/22.3; 371/22.5; 324/765
[58] Field of Search ............................ 371/22.3, 22.5, 371/22.1, 22.6; 324/765; 395/183.06, 183.19

[56] References Cited

U.S. PATENT DOCUMENTS

| | | | |
|---|---|---|---|
| 5,109,190 | 4/1992 | Sakashita et al. | 324/158 |
| 5,115,191 | 5/1992 | Yoshimori | 324/158 R |
| 5,134,314 | 7/1992 | Wehrmacher | 307/443 |
| 5,155,432 | 10/1992 | Mahoney | 324/158 R |
| 5,206,545 | 4/1993 | Huang | 307/443 |
| 5,260,949 | 11/1993 | Hashizume et al. | 371/22.3 |
| 5,426,650 | 6/1995 | Ganapathy et al. | 371/22.3 |
| 5,448,576 | 9/1995 | Russell | 371/22.3 |
| 5,471,481 | 11/1995 | Okumoto et al. | 371/22.3 |
| 5,602,855 | 2/1997 | Whetsel, Jr. | 371/22.3 |

FOREIGN PATENT DOCUMENTS

| | | |
|---|---|---|
| 0 518 550 A2 | 12/1992 | European Pat. Off. . |
| 0 522 413 A2 | 1/1993 | European Pat. Off. . |
| 0 604 032 A2 | 6/1994 | European Pat. Off. . |
| 2 220 272 | 1/1990 | United Kingdom . |
| 2 266 965 | 11/1993 | United Kingdom . |

OTHER PUBLICATIONS

Bulent Dervisoglu, "IEEE P1149.2 Description and Status Report", IEEE, Sep. 1992, pp. 79–81.

L. Whetsel, "IEEE STD. 1149.1—An Introduction", NEPCON, Feb. 1993, 10 pages.

Unapproved Draft IEEE P1149.2–D2.5, "Extended Digital Serial Subset", IEEE Aug. 1994, pp.1–37.

Nai–Chi Lee, "A Hierarchical Analog Test Bus Framework for Testing Mixed–Signal Integrated Circuits and Printed Circuit Boards", Journal of Electronic Testing, vol. 4, No. 4, Nov. 1, 1993, pp. 361–368.

David George, "Use a Reprogrammable Approach to Boundary Scan for FPGAs", EDN Electrical Design News, vol. 38, No. 16, 5 Aug. 1993, pp. 97–100.

*Primary Examiner*—Robert W. Beausoliel, Jr.
*Assistant Examiner*—Nadeem Iqbal
*Attorney, Agent, or Firm*—Scott B. Stahl; Wade James Brady, III; Richard L. Donaldson

[57] ABSTRACT

An output boundary scan cell includes an output buffer structure (51) connected between a shared capture/shift memory (17) and an output terminal. The output buffer structure is responsive to initiation of a test mode of operation for latching at the output terminal functional test data from the shared capture/shift memory and for isolating the output terminal from test data subsequently stored in the shared capture/shift memory during the test mode of operation.

12 Claims, 8 Drawing Sheets

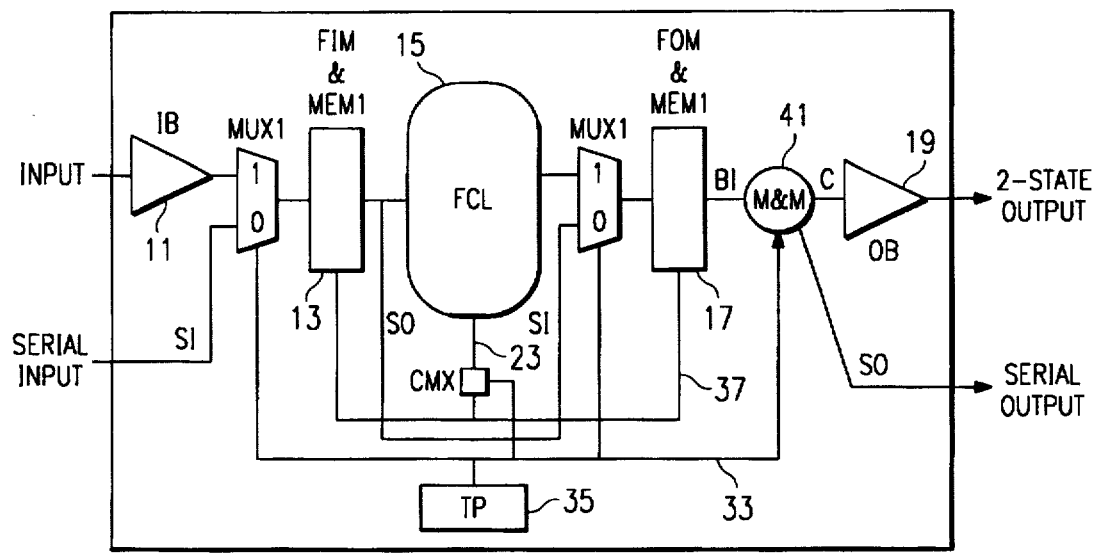
FIG. 5
*(PRIOR ART)*
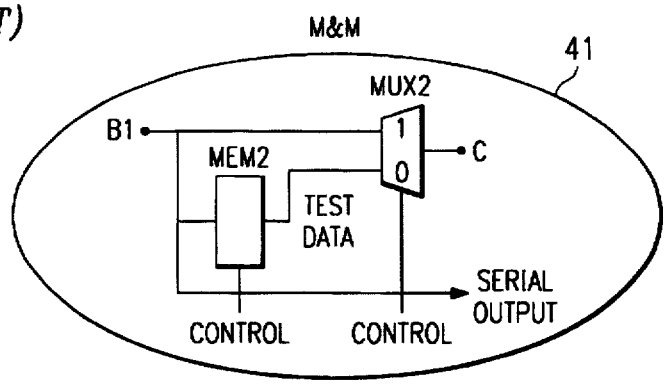
FIG. 5A
*(PRIOR ART)*
FIG. 5B
*(PRIOR ART)*
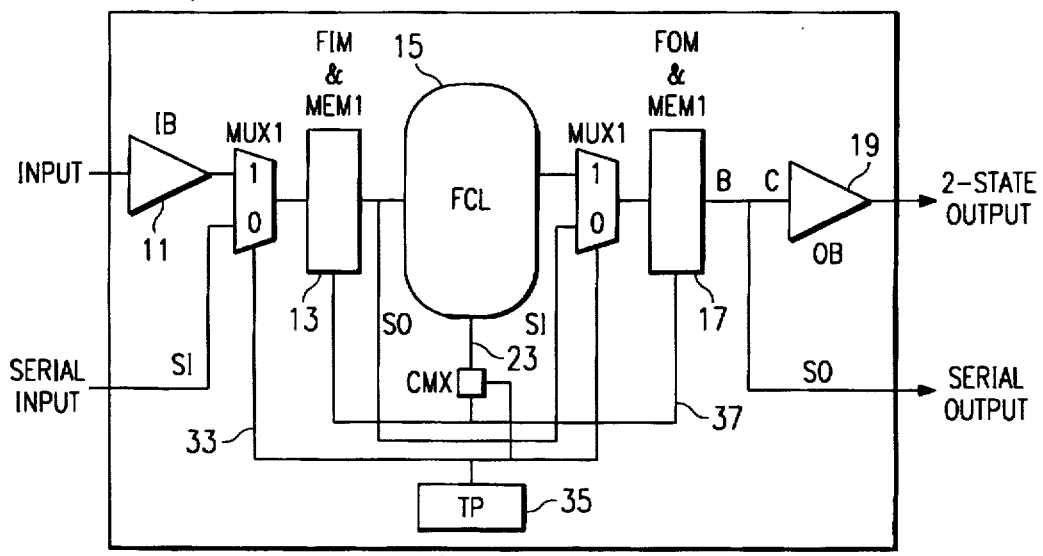

TRANSMISSION GATE
STYLE SWITCH (S)

3-STATE BUFFER
STYLE SWITCH (S)

VERY LOW OVERHEAD SHARED RESOURCE BOUNDARY SCAN DESIGN

This application is a continuation of application Ser. No. 08/342,948, filed Nov. 21, 1994 now abandoned.

CROSS-REFERENCE TO RELATED APPLICATION

The subject matter of the present application is related to subject matter disclosed in the following co-assigned, U.S. Patent document which is incorporated herein by reference:

| Docket   | PTO Reference | Effective Filing Date |
| -------- | ------------- | --------------------- |
| TI-20056 | 08/342,525    | Concurrently herewith |

TECHNICAL FIELD OF THE INVENTION

The invention relates generally to testing electrical circuitry and, more particularly, to improvements in boundary scan testing as applied to integrated circuits.

BACKGROUND OF THE INVENTION

Today boundary scan design in integrated circuits (ICs) is based on an IEEE standard referred to as 1149.1. In 1149.1, flip flops and/or latches, referred to from this point forward as memories, form the boundary scan cells at the IC input, output and bi-directional pins. These boundary scan cell memories are required to be dedicated for test operation. This means that the memories cannot be used functionally by the IC when testing is not being performed. In some ICs, it is technically advantageous to be able to use the memories functionally when the IC is in normal mode, then reuse the memories for test purposes when the IC is placed in a boundary scan test mode. Reuse of memories for function and test purposes is a common practice in internal scan design of ICs. However, 1149.1 boundary scan differs from internal scan in that it requires scan access of the IC's boundary while the IC is in normal mode. Therefore the memories of the boundary scan cells must be available for scanning at all times, forcing them to be dedicated test circuits.

The reason for the aforementioned full time scan access requirement of IEEE STD 1149.1 is two-fold. First, allowing the boundary scan path to be accessed during normal IC operation provides a way to take an on-line sample of the IC's inputs and outputs during normal operation. Second, allowing the boundary scan path to be accessed during normal IC operation provides a way to preload boundary scan memories with test data prior to entering the boundary scan test mode. Of these two requirements, preloading is the most important because it allows initializing the boundary scan cells at IC output pins with safe test data prior to switching the IC into boundary scan test mode.

Sampling has not proven to be a valuable test feature, due to problems of synchronizing the sampling with normal IC operation. Due to the ineffectiveness of sampling, it may become an optional 1149.1 test feature instead of a required test feature. If sampling were made optional, it would be possible to share memories between boundary scan cells and IC functional circuitry. However, if shared memories are used in the absence of the sampling requirement, establishing safe test data in output boundary scan cells to meet the preload requirement would be difficult since sharing of the boundary scan cell memories inhibits scan access during normal IC operation.

Another requirement for 1149.1 boundary scan cells is to control output pins to a predetermined logic condition during scan operations. To achieve this, prior art output boundary scan cells utilized two memories. The first memory is used for capturing and shifting data through the cell, and the second memory is used for holding stable test data at the output pin while the first memory captures and shifts. If the sampling operation, described above, is made optional, the first memory can be shared with functional logic. However, the second memory will be required and dedicated for test to maintain stable data from the output pin while the first shared memory captures and shifts data.

A new boundary scan standard proposal currently in development, referred to as IEEE P1149.2, is based on allowing first memories (capture/shift memory) of boundary scan cells to be either shared for functional and test purposes or dedicated for test. Also, P1149.2 makes the use of second memories (output hold memory) optional. P1149.2 thus permits an output boundary cell which contains only a shared capture/shift memory. Use of such an output boundary scan cell minimizes test logic, but the IC output pin controlled by such a cell would ripple during capture and shift operations of the shared capture/shift memory. The ripple effect on output pins during capture and shift operations can cause problems during boundary test, such as corruption of the test by rippling test data at the inputs of ICs which do not themselves implement boundary scan, causing them to enter into unknown and potentially dangerous states. For example, if output ripple were to occur from the outputs of a boundary scan IC to the inputs of an non-boundary scan IC, the non-boundary scan IC could respond to the rippling inputs (on say its clock, reset and/or enable pins) to enter into an undesired state. The undesired state could damage the IC or other ICs it is connected to. Furthermore, rippling outputs prevent full control of non-boundary scan ICs during test, and therefore limit what can and cannot be tested.

Since P1149.2 allows sharing of the capture/shift memory, scanning of capture/shift memories to preload test data to optional output hold memories prior to entering boundary scan test mode is not a required feature. In P1149.2, the IC can be simply switched from functional mode into test mode, and P1149.2 assumes that the functional data stored in the shared capture/shift memories of IC output boundary cells at the time of the switch will be safe test data to initially output from the IC. This means that an IC output boundary cell which uses only a shared capture/shift memory will initially output, in test mode, the logic condition previously being output in functional mode. Since the functional outputs from an IC will be unknown at the time of the switch to test mode, unknown test data will be output.

If, for example, a short to ground exists on an output pin when the switch to test mode occurs, and a logic one is stored in the shared capture/shift memory when the switch occurs, the output buffer will attempt to drive a logic one over the ground short. If multiple outputs are shorted to themselves, to ground or to the supply voltage, and shared capture/shift memories attempt to drive out competing voltage levels when switched into test mode, the IC outputs and/or IC itself could be damaged by excessive current flow. A similar problem would exist with P1149.2 output boundary cells that use the optional output hold memory in combination with a shared capture/shift memory, since the output hold memory cannot be preloaded with safe test data. So while P1149.2 may provide a fairly safe way to enter test mode without having to scan (preload) the output cells with test data, the test mode entry method is not safe when IC output pins are subjected to being shorted to ground, supply voltage, or to other pins. Thus, neither 1149.1 or P1149.2 provides a solution to resolving voltage contention problems that can occur at IC outputs when the IC is switched from functional to test mode.

FIGS. 1 and 2 illustrate two exemplary IC functional architectures that will be used to facilitate description of the prior art and the present invention. The IC example in FIG. 1 has an input and a 2-state output and the IC example in FIG. 2 has an input and a 3-state output. During functional operation of the ICs, input data passes through an input buffer (IB) 11 and is stored in a functional input memory (FIM) 13, for example, a latch. The output of the FIM is input to the IC's functional core logic (FCL) 15. The functional core logic outputs data to be stored in a functional output memory (FOM) 17, for example, a latch, and output from the IC via an output buffer (OB) 19 in FIG. 1 or via a 3-state output buffer (3SOB) 21 in FIG. 2. Data is stored in the FIM and FOM(s) by control output 23 from the functional core logic. The only difference between the two ICs is that the FCL of FIG. 2 outputs control 25 to a FOM 27 to enable or disable the IC's 3-state output buffer. Use of FIMs and FOMs at IC inputs and outputs is beneficial in high speed IC architectures, due to the synchronizing or pipelining effect they provide for rapid IC data input and output movement. Also FIMs and FOMs can be positioned physically close to the input and output buffers, respectively, reducing input and output time delays.

FIGS. 3 and 4 illustrate the IC architectures of FIGS. 1 and 2 when test logic for 1149.1 boundary scan is implemented therein. On IC inputs, an input boundary cell (IBC) 29 is connected to the output of the input buffer (at "A"). On 2-state IC outputs (FIG. 3), an output boundary cell (OBC) 31 is inserted in series with the data path between the FOM 17 and the 2-state output buffer (at "B" & "C"). On 3-state IC outputs (FIG. 4), an OBC 31 is inserted in series with the data path between the FOM 17 and 3-state output buffer (3SOB), and another OBC 31 is inserted in series with the control path between the FOM 27 and 3-state output buffer enable input. Examples of the IBC and OBC test logic are respectively shown in FIGS. 3A and 3B. The IBC and OBC(s) are connected serially from a serial input pin of the IC to a serial output pin of the IC to allow data to be shifted through the cells. The cells receive control via control bus 33 from a test port (TP) 35 to control their operation. It is important to note with respect to FIG. 4 that a single control path OBC can control a group of data path OBCs that form a functional 3-state bus, i.e. 1149.1 does not require that each 3-state output pin of a bus have its own control cell.

The IBC 29 of FIG. 3A contains an input multiplexer (Mux1) and a capture/shift memory (Mem1). Mux1 is controlled by the TP to input either serial data input (SI) or system data input (A) to Mem1. Mem1 loads data in response to TP control. The output of Mem1 is output as serial output (SO) data. The OBC 31 of FIG. 3B contains an input multiplexer (Mux1), a capture/shift memory (Mem1), an output hold memory (Mem2), and an output multiplexer (Mux2). Mux1 is controlled by the TP to input either serial data input (SI) or system data input (B) to Mem1. Mem1 loads data in response to TP control. The output of Mem1 is input to Mem2 and also output as serial output (SO) data. Mem2 loads data from Mem1 in response to TP control. Mux2 is controlled by the TP to output either data from Mem2 or system data (B) to the output buffer (C). The 1149.1 standard requires that the logic of IBCs and OBCs be dedicated for testing and not reused functionally by the IC.

The OBC differs from the IBC because 1149.1 boundary scan requires that the IC outputs be able to be controlled to a predetermined output logic condition, while data is captured into and shifted through the OBC. The reason for this requirement is to prevent connected IC inputs from receiving the data ripple effect that would occur from IC outputs during the capture and shift operations. This requirement forces the OBC to have two memories, a first memory (Mem1) for capturing and shifting data, and a second memory (Mem2) for maintaining the IC output pin at a desired logic condition (logic one, zero or tristate) while data is captured and shifted by the first memory. It is important to note that the OBC's Mux2 introduces a delay in both the data and control paths between the FOMs and 2-state/3-state output buffers, which can adversely impact IC performance.

The 1149.1 standard requires two types of test operations for boundary scan cells, a sample and preload operation (Sample/Preload) and an external test operation (Extest). The sample part of Sample/Preload allows the Mux1 and Mem1 of IBC and OBC to be controlled by the TP to capture and shift out system data while the IC is in normal operation. The preload part of Sample/Preload allows the TP to shift data into Mem1 of OBCs and update the data into Mem2 of OBCs, while the IC is in normal operation. The ability to preload Mem2 of OBCs before the IC is placed in Extest is important because it allows establishing what test data will be output from the IC when the IC enters Extest mode, i.e. when Mux2 of OBCs is switched from outputting system data (B) to outputting data from Mem2. Without the ability to preload Mem2, potentially damaging test data could be output from the IC when it is switched from normal to Extest operation.

When the IC is placed in Extest, Mux2 of OBC is controlled by the TP to output test data stored in Mem2 to the output buffer. In FIG. 3, the test data output from OB 19 when Extest is entered is either a logic one or zero. In FIG. 4, the test data output from 3SOB 21 when Extest is entered is either logic one, logic zero, or tristate. During Extest, OBCs are operated by the TP to shift in and update test data to IC outputs to tristate the output or drive logic levels onto wiring interconnects, and IBCs are operated by the TP to capture and shift out test data arriving at IC inputs from wiring interconnects. In this way, Extest is used to test wiring interconnects between IC inputs and outputs on, for example, a printed wiring board. The operation of both these 1149.1 test operations is well known by workers in boundary scan testing.

The usefulness of the sample part of the Sample/Preload operation is limited because it is difficult to synchronize the capture operation of the IBC's and OBC's Mem1 with the functional data arriving at and departing from the IC's inputs and outputs, respectively. This is because the IBC and OBC(s) are controlled by timing from the TP, and the FIM and FOM(s) are controlled by the timing from the functional core logic. As a result, the sample part of the Sample/Preload operation may become an optional boundary scan test feature in 1149.1, whereas now it is a required test feature. If the sample part of Sample/Preload is made optional, then the FIM and FOM(s) of the ICs in FIGS. 3 and 4 could serve as the Mem1 of the IBC and OBC(s), respectively, when the IC is placed in Extest mode.

FIGS. 5 and 6 illustrate boundary scan designs where the sample feature is omitted, enabling the FIM and FOM(s) to serve as functional memories during normal IC operation and boundary cell capture/shift memories (Mem1) during test operation. This reduces the boundary scan test logic overhead at input pins by one memory, overhead at 2-state output pins (FIG. 5) by one memory, and overhead at 3-state output pins (FIG. 6) by two memories. To use the FIM and FOM as functional and test memories, the control 37 to each must be switchable to allow the FIM and FOM to operate in response to control 23 from the functional core logic during normal operation, and in response to control from TP during test operation. To achieve this, a control multiplexing (CMX) circuit is shown in FIGS. 5 and 6 to allow switching of control between test and normal operations. The CMX circuit allows control from the functional core logic or control from the TP to be globally distributed to each FIM and FOM. Control to switch the CMX comes from the TP.

In FIGS. 5 and 6, it is seen that, when using shared FIMs, the IBC function is implemented with only Mux 1 required as dedicated test circuitry. In FIGS. 5 and 6, it is seen that, when using shared FOMs, the OBC function is implemented with only Mux1, Mem2 and Mux2 as dedicated test circuitry. The Mem2 and Mux2 (M&M) circuitry 41 is shown in FIG. 5A. It is important to note that Mem2 and Mux2 (M&M) must still be inserted between the shared FOM and output buffer (at "B1" and "C"). Also it is important to note that the Mux2 delay on the data and control paths is maintained in the boundary scan designs of FIGS. 5 and 6, which adversely impacts IC performance.

Although it is possible to share a functional memory with the Mem2 function, to do this would require at least one additional multiplexer and additional wire routing to enable a memory inside the FCL to be coupled to Mux2 and the shared FOM (17 or 27).

A problem with the boundary scan designs of FIGS. 5 and 6 is that there is no way to preload Mem2 by scanning data into Mem1 as previously described for the boundary scan designs of FIGS. 3 and 4. This is because the shared FOM (Mem1) is used functionally by the IC and therefore cannot be scanned by the TP to input safe test data to upload into Mem2. Thus when the IC is initially placed into Extest, Mux2 is switched to output unknown test data from Mem2 to the 2-state output buffer of FIG. 5 and 3-state output buffer of FIG. 6. This unknown test data may cause the output buffers to output conditions that might damage other circuits or output buffers when Extest is entered. So while the shared boundary scan design of FIGS. 5 and 6 does reduce the test logic overhead at IC input and output pins, it is not able to initially enter Extest with safe test conditions being output from the IC. After Extest is entered, and following the first scan operation to the IBC and OBC(s), the Mem2 at output pins is uploaded with safe test data from the shared Mem1 memory. However, the period of time between the initial entry into Extest and the updating of safe test data into Mem2 provides an opportunity for circuitry and/or buffer damage.

The boundary scan cells of FIGS. 5 and 6 are similar to those proposed in the P1149.2 boundary scan standard, in that Mem1 is shared with a functional memory (FOM). In P1149.2, the M&M circuitry in the data path of FIGS. 5 and 6 between the shared Mem1 17 and 2-state or 3-state output buffer can be optionally deleted, allowing the output of the shared Mem1 17 to be directly input to the 2-state or 3-state output buffer, as shown in FIGS. 5B and 6A. However, P1149.2, like 1149.1, requires that the M&M circuitry be placed in series between the output of the shared Mem1 27 and the 3-state control input of the 3-state output buffer 3SOB. The requirement to place the M&M circuitry in the control path allows the 3-state output to be controlled to either a 3-state or enabled condition while data is captured and shifted through the shared Mem1 27 of the control path. However, with the M&M circuitry optionally deleted from the data paths of 2-state and 3-state outputs, the data from these pins, assuming the 3-state output is enabled (which it must be to permit updating test data to the output pin during Extest), will ripple as data is captured and shifted through the shared Mem1s 17 of the data path. As mentioned previously, the rippling of data outputs during capture and shift operations can cause damage to ICs and/or limit what can and cannot be tested.

With the growing interest in sharing memories between functional and boundary scan circuits, and with the above-described problems associated with shared memories, a need has arisen for improved OBCs for 2-state and 3-state output buffers. The present invention provides a boundary scan cell including a shared capture/shift memory, and an output buffer structure which provides the ability to; (1) establish safe test data at IC outputs when the IC is switched from functional mode to boundary test mode without first having to scan safe test data in, (2) quickly resolve voltage contention problems at IC output pins due to shorts between pins, ground or supply voltage, and (3) maintain stable test data at output pins while data is captured and shifted through shared capture/shift memories, without having to use an output hold memory.

The boundary scan cell of the present invention requires very low overhead when used on 2-state and 3-state type IC output pins.

BRIEF DESCRIPTION OF THE DRAWINGS

FIGS. 3, 3A, 3B, 4, 5, 5A, 5B, 6, 6A illustrate prior art boundary scan designs.

DETAILED DESCRIPTION OF THE INVENTION

Figure 7:
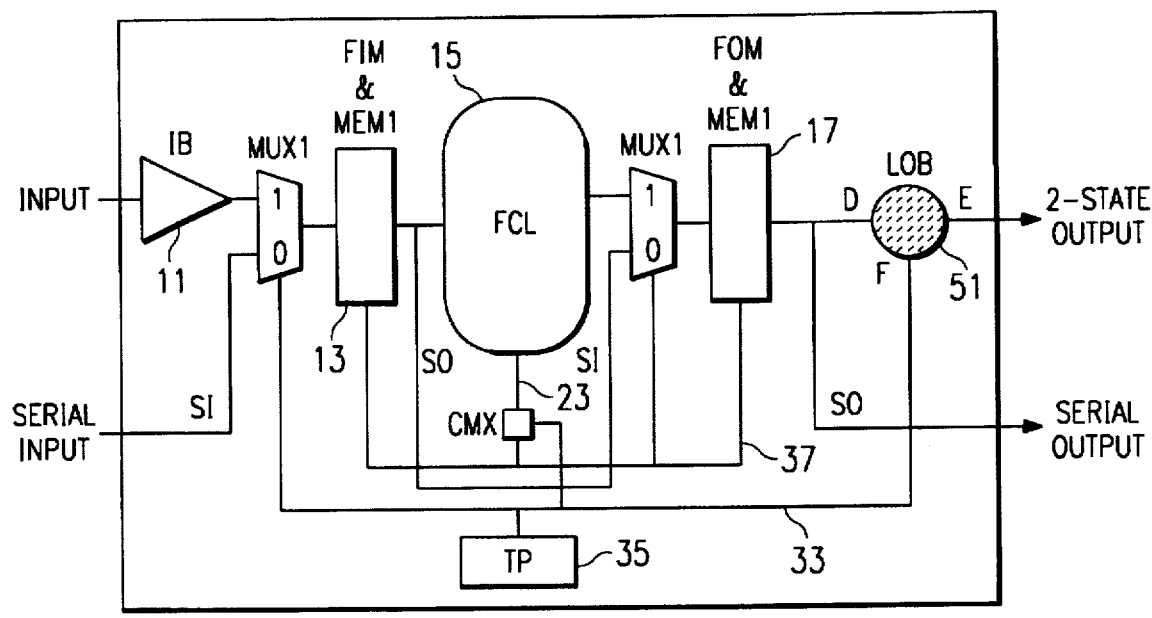
FIG. 7, 7A, 7B, 7C illustrates an exemplary boundary scan design according to the present invention, for use with a 2-state output.

In FIG. 7, an IC is shown sharing FIMs and FOMs with IBC and OBC Mem1's as described in FIG. 5. The IBC implementations of FIGS. 5 and 7 are the same. In the OBC implementation of FIG. 7, the Mem1 function is shared with the FOM 17, the Mux1 function remains as required test logic, and the Mem2 and Mux2 functions (M&M) are eliminated. The elimination of Mux2 and Mem2 is made possible by a novel latchable output buffer (LOB) design shown at 51 in FIG. 7. The LOB is connected to the output of the shared FOM (at D), the output pin (at E), and TP (at F) of FIG. 7.

Figure 1:
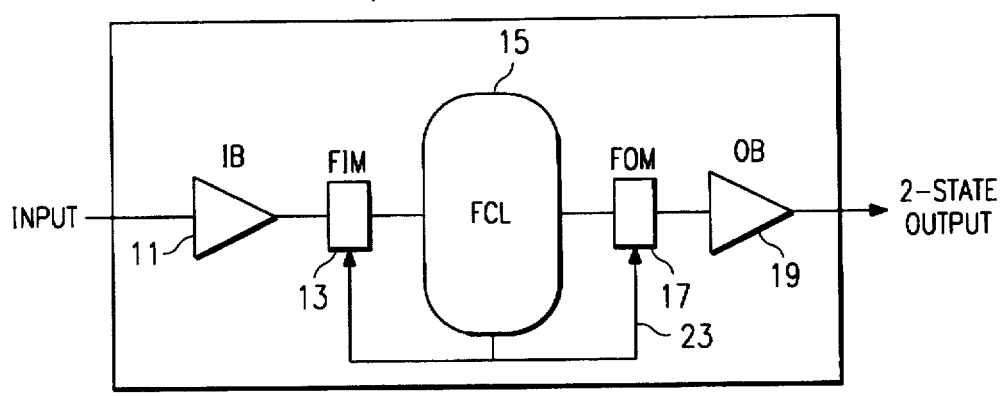
FIGS. 1 and 2 illustrate exemplary IC functional architectures to which the present invention is applicable.
Figure 7A:
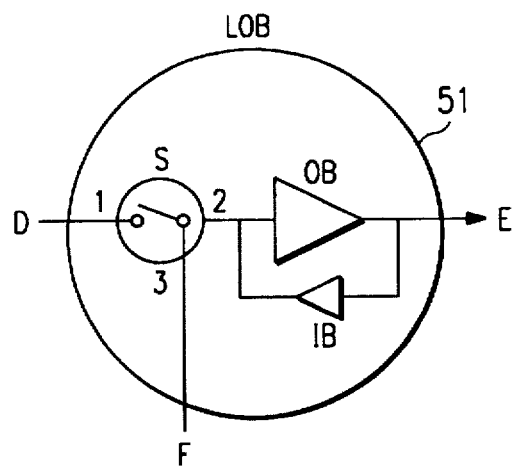

A circuit example of the LOB 51 is shown in FIG. 7A. The LOB includes a switch (S), an output buffer (OB), and an input buffer (IB). The switch has an input terminal (1) for connection to the IC functional circuitry (at D), an output terminal (2) for connection to the input of the OB, and a control terminal (3) for connection to the TP (at F). The OB has an input connected to the output terminal (2) and an output connected to the IC pin (at E). The IB has an input connected to the output of the OB (at E) and an output connected to the input of the OB. During normal IC operation, the switch S is closed by control input at 3 from TP and functional data from the FOM 17 is output from the IC pin via the OB. While the switch S is closed, the output from IB is designed to be overdriven by the data from the FOM, making the IB transparent to the operation of the LOB during normal IC operation. So during normal operation the 2-state output of FIG. 7 operates as the 2-state output of the IC in FIG. 1.

Figure 7B:
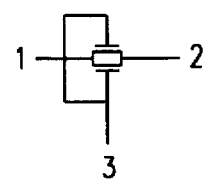
Figure 7C:
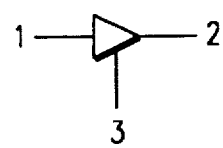

During Extest, the switch S is operated by TP to open and close as required during testing. When the switch is opened, the IB provides feedback to the input of the OB to latch the test data currently being output from OB. When the switch is closed, test data from the FOM overdrives the IB and is output from the OB. Some switch circuit examples that could be used as switch S in the LOB are shown in FIGS. 7B and 7C, i.e. the transmission gate and 3-state buffer.

Figure 6:
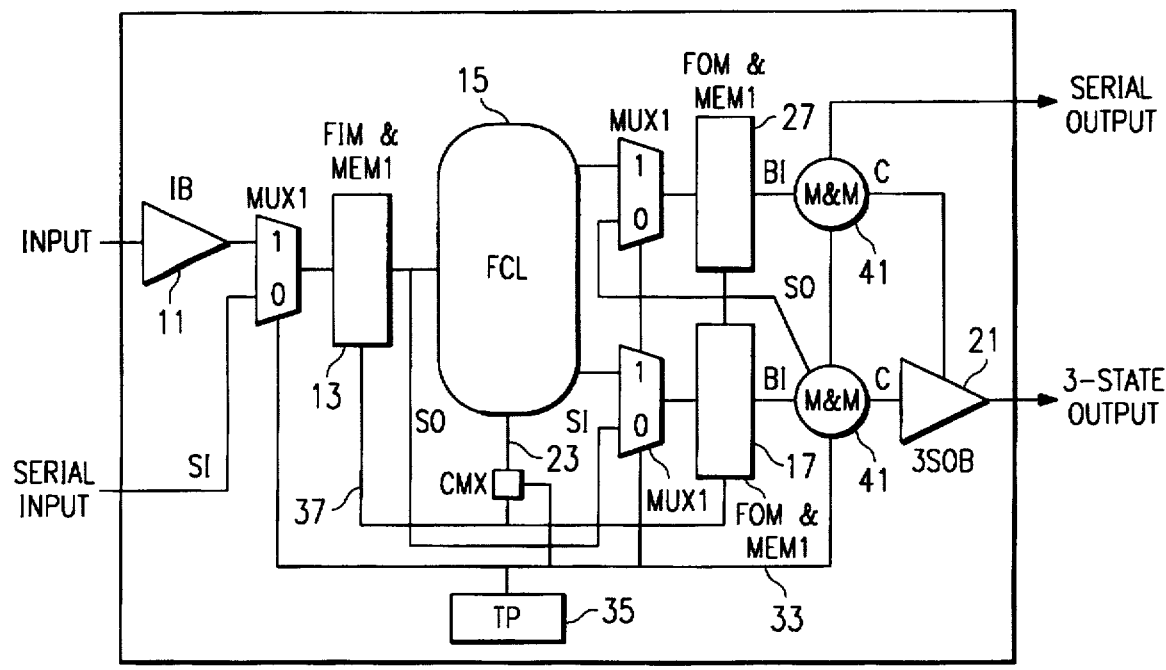
Figure 6A:
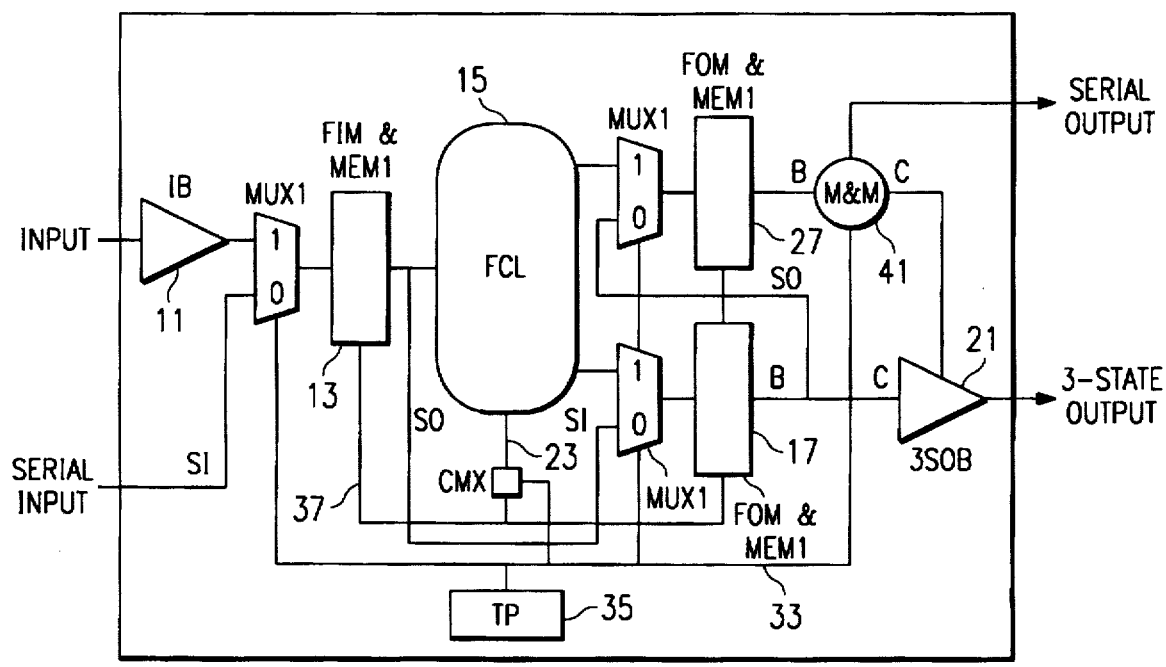
Figure 8:
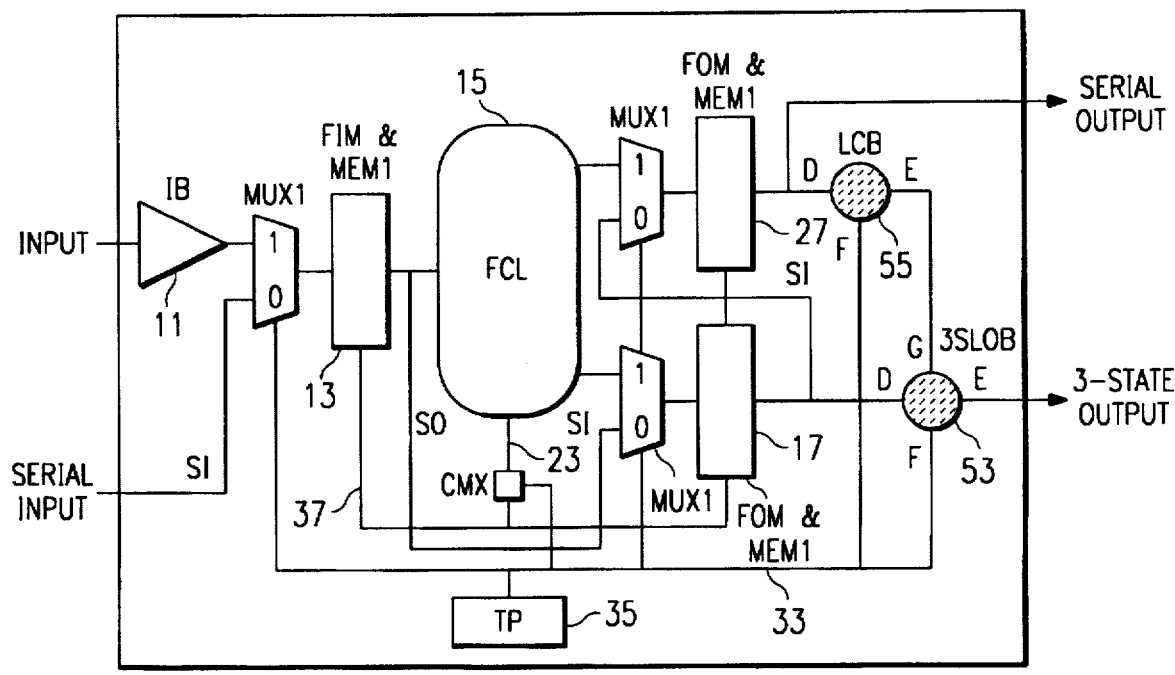
FIG. 8, 8A, 8B illustrates an exemplary boundary scan design according to the present invention, for use with a 3-state output.

In FIG. 8, an IC is shown sharing FIMs and FOMs with IBC and OBC Mem1's as described in FIG. 6. The IBC implementations of FIGS. 6 and 8 are the same. In the OBC implementations of FIG. 8, the Mem1 functions are shared with the FOMs 17 and 27, the Mux1 functions remain as required test logic, and the Mem2 and Mux2 functions (M&M) are eliminated. The elimination of Mux2 and Mem2 in the data path is made possible by a novel 3-state latchable output buffer (3SLOB) design shown at 53 in FIG. 8. The elimination of Mux2 and Mem2 in the control path is made possible by a novel latchable control buffer (LCB) design shown at 55 in FIG. 8. The 3SLOB is connected to the output of the shared data path FOM 17 (at D), the output pin (at E), TP (at F), and a control output of the LCB (at G). The LCB is connected to the output of the shared control path FOM 27 (at D), the control input G of the 3SLOB (at E), and TP (at F).

Figure 8A:
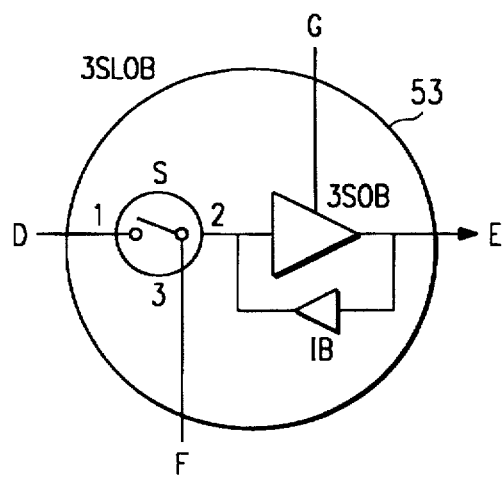

A circuit example of the 3SLOB 53 is shown in FIG. 8A. The 3SLOB includes a switch (S), a 3-state output buffer (3SOB), and an input buffer (IB). The structure and operation of the 3SLOB is similar to the previously described LOB of FIG. 7. The difference between the LOB and 3SLOB is that the 3SLOB contains a 3SOB and a control input (G) to enable or disable the drive of the 3SOB.

Figure 8B:
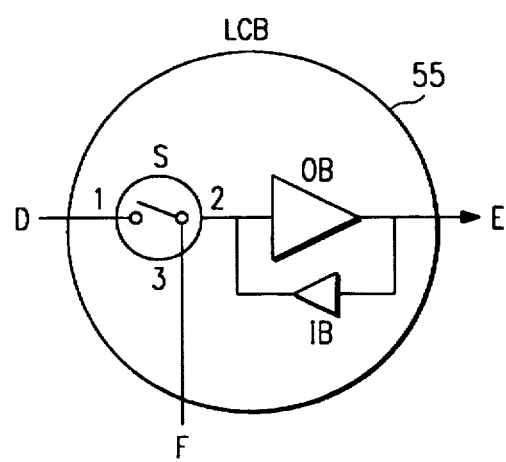

A circuit example of the LCB 55 is shown in FIG. 8B. The LCB includes a switch (S), an output buffer (OB), and an input buffer (IB). The structure and operation of the LCB is similar to the previously described LOB of FIG. 7. The difference between the LOB and LCB is that the LCB uses smaller functional buffers for OB and IB, whereas the LOB uses larger buffers to drive the IC output pins. For example, the IB function of the LCB could be realized by a simple pass transistor or transmission gate instead of an actual buffer.

Figure 2:
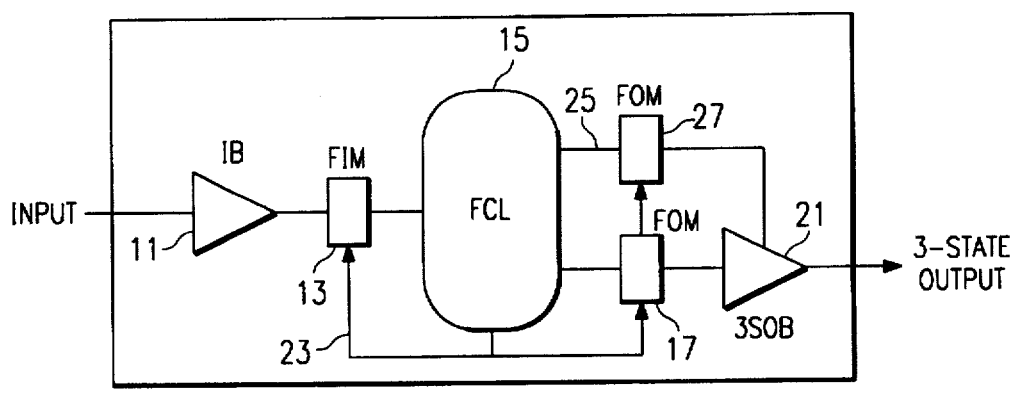

During normal IC operation in FIG. 8, the switches of the 3SLOB and LCB are closed by control input from TP, and functional data and control from the FOMs define the state of the IC's 3-state output pin. While the switches of 3SLOB and LCB are closed, the outputs from the IBs of 3SLOB and LCB are designed to be overdriven by the data from FOM 17 and control from FOM 27, respectively, making the IBs transparent to the operation of the 3SLOB and LCB during normal IC operation. So during normal operation the 3-state output of FIG. 8 operates as the 3-state output of FIG. 2.

During Extest, the switches of LCB and 3SLOB are operated by TP to open and close as required during testing. When the switch of the LCB is opened, the IB provides feedback to the input of the OB to latch the test data (3-state control) currently being output from the OB to the 3SLOB. When the switch of the LCB is closed, test data from the control FOM 27 overdrives the IB and is output from the OB to the 3SLOB. When the switch of the 3SLOB is opened, the IB provides feedback to the input of the 3SOB to latch the test data currently being output from the 3SOB to the 3-state output pin. When the switch of the 3SLOB is closed, test data from the data FOM 17 overdrives the IB and is output from the 3SOB to the 3-state output pin.

Note that if the control input to the 3SLOB from the LCB disables the 3SLOB's 3SOB, the 3-state output pin drive will be disabled. When the 3-state output pin is disabled, the IB of the 3SLOB will input to the 3SOB, but the 3SOB cannot drive out what is being input. For example, if the 3-state output pin of FIGS. 8–8A is disabled, and a connected 3-state output pin is enabled, then the IB of FIG. 8A will input to 3SOB the data driven from the enabled pin but the 3SOB of FIG. 8A cannot output the data.

The LOB, LCB and 3SLOB of FIGS. 7A, 8B and 8A could be implemented with an IB that is enabled to drive the OB/3SOB input when the switch is opened by TP input (at F), and disabled from driving the OB/3SOB input when the switch is closed by TP input (at F). However, regardless of the implementation style, the function of the IB is to provide feedback to the OB/3SOB to maintain a logic state at the output pin when the switch is opened. It is also important to note that the LOB, LCB and 3SOB eliminate the Mux2 delay and signal loading by Mux2 and Mem2 seen in the OBCs of FIGS. 5 and 6, which results in improved IC performance.

One problem mentioned previously with the prior art boundary scan designs of FIGS. 5 and 6 was that sharing functional memories for Mem1 prevents scanning Mem1 to preload Mem2 with safe test data prior to entering Extest. Note that the output boundary cells of the boundary scan designs in FIGS. 7 and 8 don't have a Mem2 or Mux2. The Mem2 and Mux2 cell functions are realized by the LOB of FIG. 7 and by the 3SLOB and LCB of FIG. 8 the instant the IC switches from normal operation to Extest mode. During normal operation, LOB, 3SLOB and LCB are driven by the IC's functional core logic to output functional data. The functional data output during normal mode is safe to output when the IC is switched into Extest mode. Therefore the LOB, 3SLOB and LCB of FIGS. 7 and 8 all latch and hold their last functional data value when they receive control from TP to switch from functional operation into Extest.

To place the IC in Extest, TP outputs control to open the switch of LOB (FIG. 7), or the switches of 3SLOB and LCB (FIG. 8). When the switch opens, the input drive from the associated FOM is disabled and the present functional state of the output pin is maintained by the feedback provided by the IB. For example, in FIG. 7, if the LOB was outputting a logic level to the 2-state output pin in functional mode when TP opens the LOB's switch to enter Extest, the logic level being output from the LOB's OB is fed back to the input of the OB and latched, via the IB. Thus the LOB provides a way to latch the last functional logic level state being driven out of a 2-state output when Extest is entered. In FIG. 8, if the 3SLOB and LCB were outputting data and control for the 3-state output in functional mode when TP opens their switches to enter Extest, the data and control being output respectively from the 3SLOB's 3SOB and the LCB's OB are fed back to the inputs of the 3SOB and OB, respectively, and latched, via the IBs. Thus the 3SLOB and LCB provide a way to latch the last functional logic condition being driven out of a 3-state output when Extest is entered.

The above-described feature of maintaining the last functional output state when an IC transitions from functional mode to Extest mode provides a safer method of Extest entry than that offered by the OBCs of FIGS. 5 and 6. Furthermore, if during entry into Extest an output buffer was placed in contention with another output buffer, or shorted to ground or supply voltages, the voltage contention would be quickly resolved by the feedback mechanism built into the LOB and 3SLOB. For example, if a short to ground existed on an output pin and the functional logic of the IC was attempting to output a logic one through an LOB when Extest was entered, the LOB's switch would open and the feedback provided by IB would cause OB to output a logic zero, ending the voltage contention at the 2-state output pin.

Figure 3:
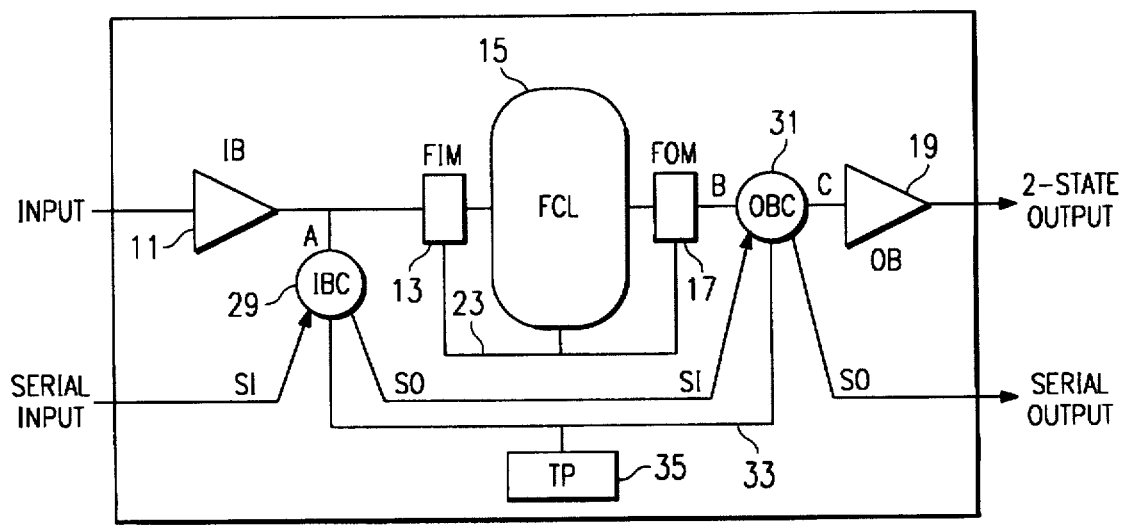
Figure 3A:
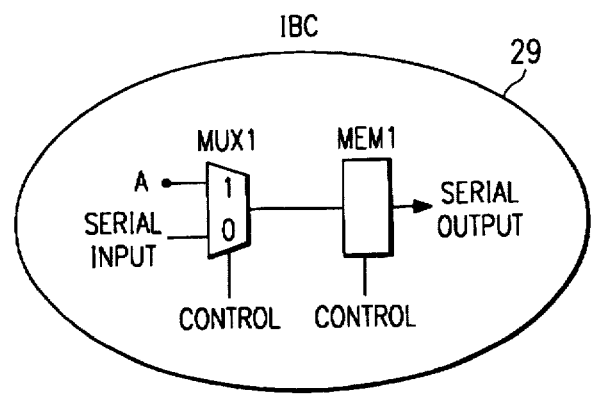
Figure 3B:
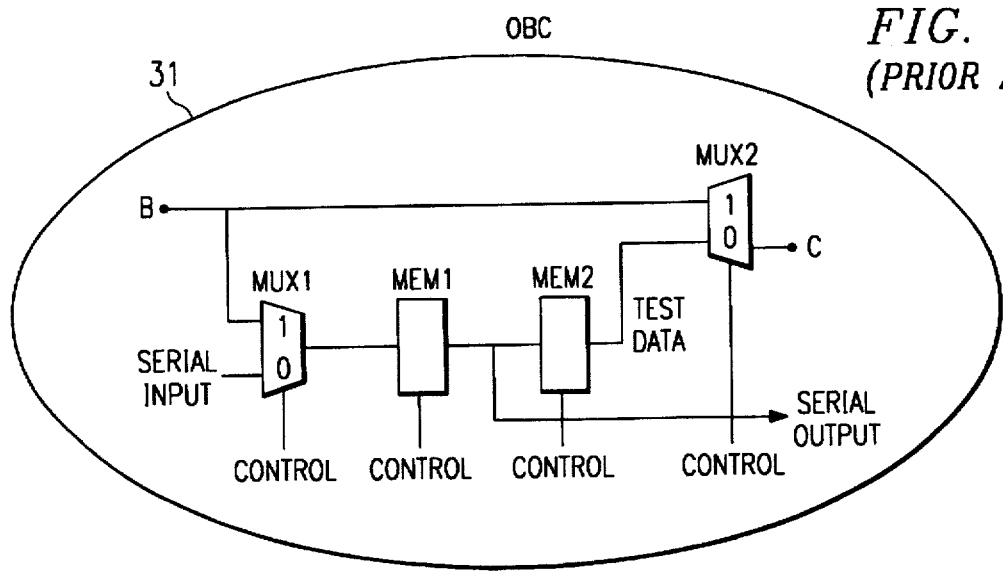
Figure 4:
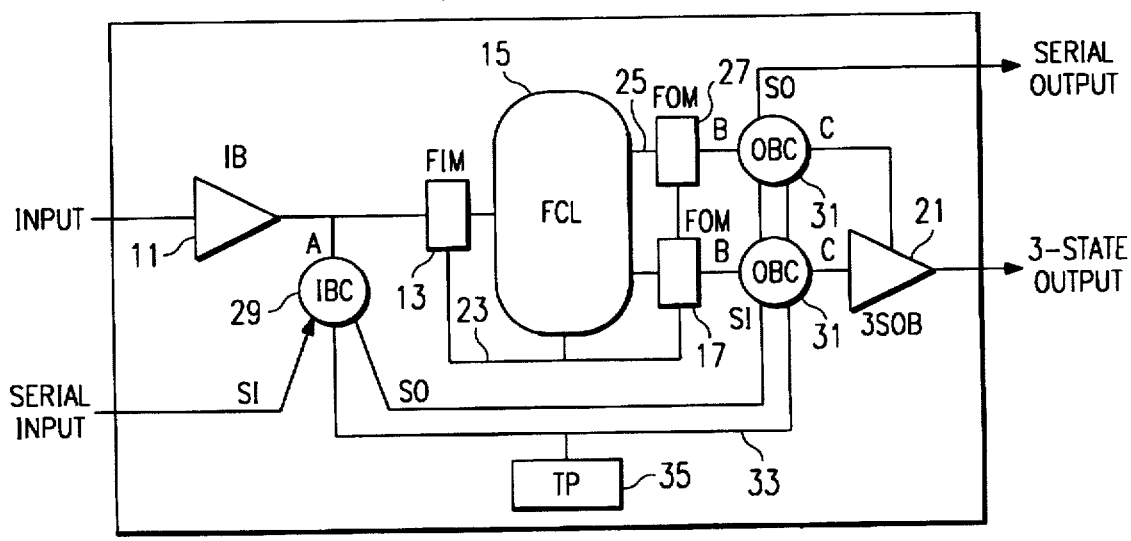

After Extest is entered and safe outputs have been established at IC outputs, the TP can scan Mem1 to perform the 1149.1 capture, shift and update operations as described in FIGS. 3 and 4. Note that the 3SLOB, LCB and LOB, in addition to establishing safe test output conditions upon Extest entry, also provide the Mem2 function of maintaining stable test data to output pins while Mem1 captures and shifts data during Extest. This is accomplished by TP opening the switches of the 3SLOB, LCB and LOB during capture and shift operations. The switches of 3SLOB, LCB and LOB are then momentarily closed at the end of the capture and shift operations to permit new test data to be updated from Mem1 to the IC output via 3SOB and OB of 3SLOB and LOB. Although it is preferred to close the switches only momentarily at the end of the capture/shift operations, the switches can, if desired, remain closed until immediately before the next capture/shift operation, but the above-described resolution of voltage contention will not occur unless the switch is open.

Figure 9:
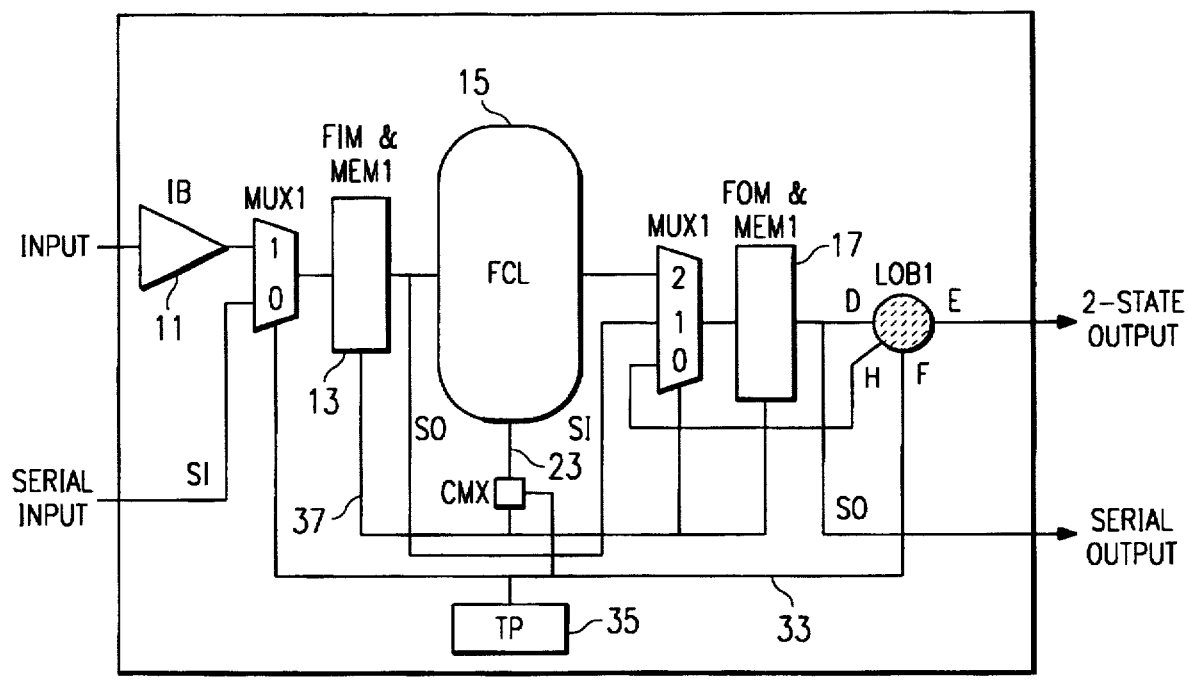
FIG. 9, 9A illustrates another exemplary boundary scan design according to the present invention, for use with a 2-state output.
Figure 9A:
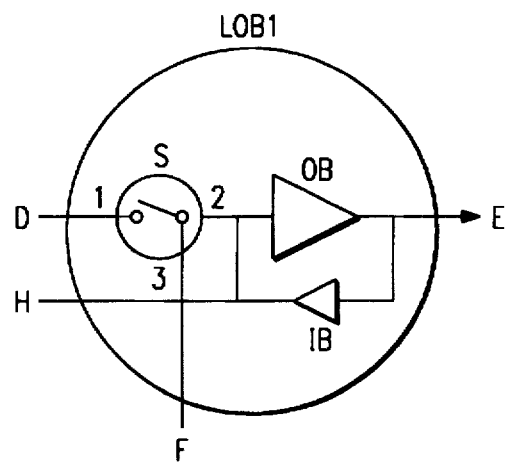
Figure 10:
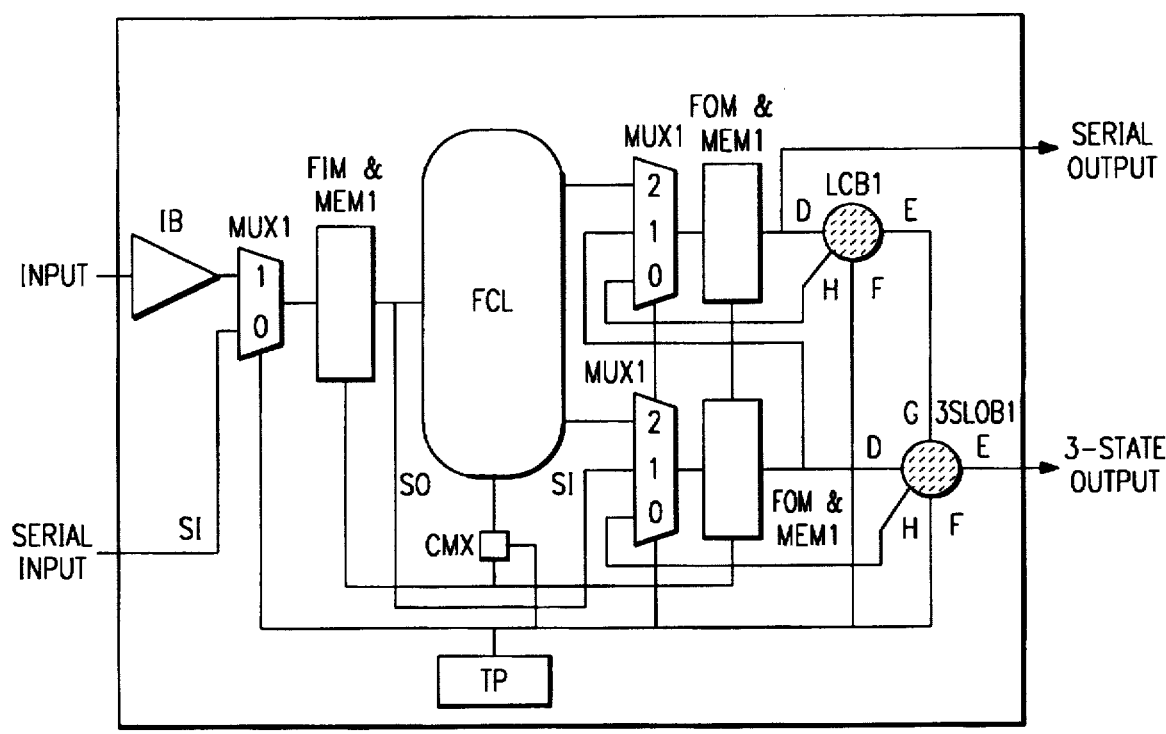
FIG. 10, 10A, 10B illustrates another exemplary boundary scan design according to the present invention, for use with a 3-state output.
Figure 10A:
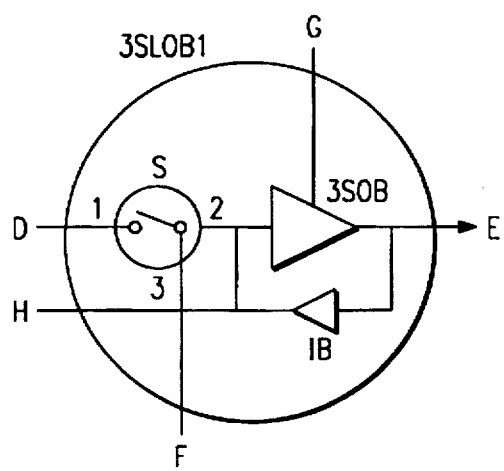
Figure 10B:
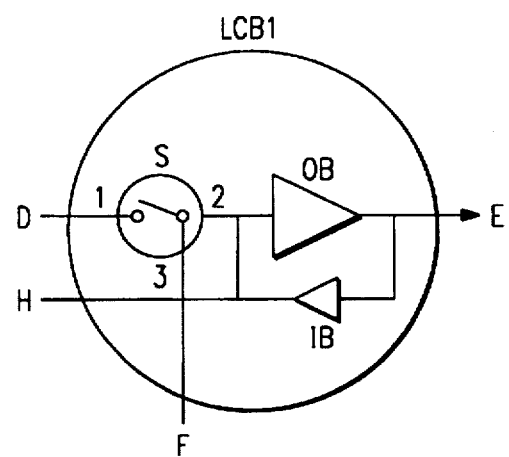

In FIGS. 9 and 10, LOB1, 3SLOB1 and LCB1 are similar to the above-described LOB, 3SLOB and LCB, but are designed to allow Mem1 to capture the test data output from each by adding a signal output (H) from the IBs. The signal output H is shown in the LOB1, 3SLOB1 and LCB1 of FIGS. 9A, 10A and 10B, respectively. The signal output (H) is connected to an additional input to Mux1 of each associated Mem1. This allows Mem1 to selectively capture either system data from the functional core logic (using the pre-existing mux input) or the test data output H from the LOB1, 3SLOB1 and LCB1 (using the added mux input). The selectivity control to determine what is captured comes from TP. The ability to capture the output of the LOB1, 3SLOB1 and LCB1 allows testing to see if a 2-state or 3-state pin output is actually driving out the logic level expected. For example, if the LOB1 in FIG. 9 is updated with a logic one and the 2-state output pin is shorted to ground, the feedback in LOB1 will cause the output to go to and latch at a logic zero when switch S opens. During the next capture and shift operation (assuming Mux1 is set to load signal H from the LOB1 into Mem1), the logic zero condition of the 2-state output will be seen to be different from the expected logic one that was previously updated, making the short to ground condition on the 2-state pin detectable. A similar output condition detection test is possible on 3-state output pins by being able to capture and shift out for inspection the data and control outputs from 3SOB1 and LCB1. Another advantage of allowing the output of LOB1, 3SLOB1 and LCB1 to be captured into Mem1 is that when the IC is initially switched from functional operation into Extest, a capture and shift operation of Mem1 allows the initial test conditions at 2-state and 3-state output pins to be observed.

As described above, the present invention provides: a self initializing and self-correcting boundary scan cell for the data path of 2-state output pins; a self initializing and self-correcting boundary scan cell for the data path of 3-state output pins; a self initializing boundary scan cell for the control path of 3-state output pins; 2-state and 3-state output boundary scan cells with ripple free outputs during capture and shift operations without requiring use of an output hold memory; 2-state and 3-state output boundary scan cells with Mux2 and Mem2 test functions that are transparent while IC is in normal functioning mode; and an output boundary scan design with reduced signal delay for 2-state and 3-state output buffers In the prior art 1149.1 boundary scan design of FIG. 3 it is seen that each 2-state IC output pin requires dedicated test logic for realizing; Mux1, Mem1, Mem2 and Mux2. In the prior art 1149.1 boundary scan design of FIG. 4 it is seen that each 3-state IC output pin, that has its own 3-state control, requires dedicated test logic for realizing; two Mux1s, two Mem1s, two Mem2s, and two Mux2s. In the prior art shared boundary scan design of FIG. 5 it is seen that each 2-state IC output pin requires dedicated test logic for realizing; Mux1, Mem2 and Mux2. In the prior art shared boundary scan design of FIG. 6 it is seen that each 3-state IC output, that has its own 3-state control, requires dedicated test logic for realizing; two Mux1s, two Mem2s and two Mux2s. In the shared boundary scan design of the present invention in FIGS. 7 and 9 it is seen that each 2-state IC output pin requires dedicated test logic for realizing Mux1. In the shared boundary scan design of the present invention in FIGS. 8 and 10 it is seen that each 3-state IC output, that has it own 3-state control, requires dedicated test logic for realizing two Mux1s and an LCB/LCB1. It is important to note that while the LOB/LOB1 and 3SLOB/3SLOB1 include additional circuitry (i.e. the IB and S) not included in the prior art, this additional circuitry is advantageously implemented in the buffer pad region of the IC, and therefore does not consume circuitry in the area of the IC function core logic. The present invention thus provides an output buffer design with the equivalent of prior art Mux2 and Mem2 functions implemented transparently within the output buffer pad region.

Although exemplary embodiments of the present invention are described above, this description does not limit the scope of the invention, which can be practiced in a variety of embodiments.

What is claimed is:
1. An electrical circuit, comprising:
functional circuitry for performing normal operating functions of the electrical circuit;
an output terminal coupled to said functional circuitry and accessible externally of the electrical circuit;
a test data path for providing test data;
memory circuitry for storing data therein, said memory circuitry having an input which is selectively connectable to said functional circuitry and is selectively connectable to said test data path, said memory circuitry having a normal mode of operation wherein functional data from said functional circuitry is received at said input and stored in said memory circuitry, and having a test mode of operation wherein test data from said test data path is received at said input and stored in said memory circuitry;
test control circuitry for selectively connecting said input to said functional circuitry to initiate said normal mode of operation and for selectively connecting said input to said test data path to initiate said test mode of operation; and
an output buffer structure, connected between said output terminal and said memory circuitry, and responsive to initiation of said test mode of operation for latching at said output terminal functional data stored in said memory circuitry and for isolating said output terminal from test data subsequently stored in said memory circuitry during said test mode of operation.

2. The circuit of claim 1, wherein said output buffer structure includes an output buffer having an output coupled to said output terminal and having an input coupled to an output of said memory circuitry.

3. The circuit of claim 2, wherein said output buffer structure includes a feedback path for connecting said output of said output buffer to said input of said output buffer.

4. The circuit of claim 3, wherein said feedback path includes a buffer which can be overdriven by said output of said memory circuitry.

5. The circuit of claim 2, including a switch structure connected between said input of said output buffer and said output of said memory circuitry.

6. The circuit of claim 5, wherein said switch structure includes a transmission gate.

7. The circuit of claim 5, wherein said switch structure includes a 3-state buffer.

8. The circuit of claim 5, wherein said output buffer structure includes a feedback path for connecting said output of said output buffer to said input of said output buffer, said switch structure connected between said output of said memory circuitry and said feedback path.

9. The circuit of claim 8, wherein said feedback path includes a buffer which can be overdriven by said output of said memory circuitry.

10. The circuit of claim 2, wherein said output buffer is a 2-state buffer.

11. The circuit of claim 2, wherein said output buffer is a 3-state buffer.

12. The circuit of claim 1 provided as an integrated circuit.

* * * * *